United States Patent [19]

Ohara et al.

[11] Patent Number: 4,509,156
[45] Date of Patent: Apr. 2, 1985

[54] SEMICONDUCTOR LASER DRIVING SYSTEM

[75] Inventors: Shunji Ohara; Tomio Yoshida; Isao Satoh, all of Osaka; Kenji Koishi, Hyogo, all of Japan

[73] Assignee: Matsushita Electric Industrial Co., Ltd., Osaka, Japan

[21] Appl. No.: 445,273

[22] Filed: Nov. 29, 1982

[30] Foreign Application Priority Data

Dec. 1, 1981 [JP] Japan .................................. 56-193971

[51] Int. Cl.$^3$ .......................... G11B 7/00; G11B 27/36
[52] U.S. Cl. ........................................ 369/54; 369/59; 369/116; 369/111
[58] Field of Search ............... 369/116, 106, 111, 121, 369/122, 53, 54, 58, 124, 59; 250/205; 346/76 L

[56] References Cited

U.S. PATENT DOCUMENTS

| 4,051,329 | 9/1977 | Blondet | 369/116 |
| 4,283,785 | 8/1981 | Miyauchi | 369/116 |
| 4,426,693 | 1/1984 | Satoh | 369/116 |

*Primary Examiner*—Alan Faber

*Attorney, Agent, or Firm*—Burgess, Ryan & Wayne

[57] ABSTRACT

A system for driving a semiconductor laser which is especially adapted for use with an optical recording and reproducing device is disclosed. In the write mode the power of laser light emitted from the semiconductor laser is so raised above a threshold or critical level that the laser beam focused on the surface of a recording medium can cause physical, chemical or electromagnetical changes thereof, but in the readout or reproduction mode, the power of laser light is lowered than the threshold or critical level and focused on the recording medium. A laser light power control loop is provided which is enabled or energized only in the readout or reproduction mode, so that the laser light can be maintained at a predetermined level. On the other hand, this control loop is disabled in the write or recording mode so that a predetermined value of current is superposed on the readout current sampled and held immediately before the write or recording mode is initiated and the current thus superposed flows into the semiconductor laser, whereby the power of laser light can be rapidly raised from the readout or reproducing laser light power to the write or recording laser light power.

4 Claims, 7 Drawing Figures

SEMICONDUCTOR LASER DRIVING SYSTEM

BACKGROUND OF THE INVENTION

The present invention relates to a system for driving a semiconductor laser, whereby the power of laser light emitted from the semiconductor laser or a light source can be suitably controlled depending upon the readout or reproduction mode or the write or recording mode.

There has been invented and demonstrated an optical recording and reproducing device or system in which the light beam from a light source and more particularly the laser light emitted is focused into a light spot of less than one micrometer in diameter on a photosensitive medium vacuum deposited or otherwise formed on a surface of a disk-like base so that the video signal or the digital signal can be recorded in or reproduced from concentric circular or spiral tracks arranged in accordance with a predetermined pattern or in a random order on the disk. With the optical recording and reproducing device or system of the type described, it has been well known in the art that the power or intensity of laser light varies over a wide range depending upon the environmental temperature so that it has been extremely difficult to stabilize the intensity of laser light constantly regardless of the environmental temperature. To put into another way, there has been a strong demand of long standing for a semiconductor system which can emit the laser light with a predetermined intensity regardless of the environmental temperature. In order to solve this problem, there has been invented and used a system in which a feedback system is provided in such a way that in response to the output from a photosensor or the like which is adapted to sense the intensity of light emitted from a semiconductor laser in which light is reflected back and forth in an optical resonator, the current for driving the laser is controlled, whereby the intensity of the laser light emitted can be maintained at a desired level.

However, if the laser light power or intensity control system of the type described above is employed in an optical recording and reproducing device in which a semiconductor laser is used as a light source and the power or intensity of light emitted from the semiconductor laser is switched depending upon the readout or reproduction mode or the write or recording mode, there arise a variety of problems or drawbacks. In the case of the optical recording and reproducing device with a semiconductor laser, the power $P_R$ of the laser light emitted from the semiconductor for readout or reproduction is considerably different in level from the power $P_W$ of laser light used in writing or recording data or information. For instance, in the case of an optical recording and reproducing disk rapidly spinning at a speed of, for instance, 1800 rpm, the write or recording power $P_W$ must be increased by about 5 to 10 times as high as the readout power $P_R$. If the power control circuits or the like are employed for controlling the readout power $P_R$ and the write power $P_W$, respectively, the time interval required for the readout power $P_R$ to charge to the write power $P_W$ when the optical recording and reproducing device is switched from the readout mode to the write or recording mode is dependent upon the response characteristics (frequency characteristics) of the power control circuits or the like. As a result, the rise time; that is, the time required for the readout power $P_R$ to rise to the write power $P_W$, becomes longer. This slow rise time adversely affects an optical recording and reproducing device or system in which the power or intensity of laser light emitted from a light source or a semiconductor laser must be switched depending upon the readout or reproduction mode or the write or recording mode. More specifically, there arises a serious problem that because of a slow rise time; that is, the time interval required for the readout power $P_R$ to rise to the write power $P_W$, it becomes impossible to record positively the leading portion of the information to be recorded. To put into another way, data or information at the beginning portion of a series of data or information to be recorded would be missed.

SUMMARY OF THE INVENTION

In view of the above, the primary object of the present invention is to provide an optical recording and reproducing device of the type employing a semiconductor laser as a single write-and-read light source which can ensure the emission of readout or reproduction laser light power of a predetermined level and write or recording laser light power in a heretofore impossible stable manner and which the rise time; that is, the time interval required for the readout or reproduction power $P_R$ to rise to the write or recording power $P_W$ can be shortened as much as possible.

Briefly stated, to the above and other ends, according to the present invention, in the readout or reproduction mode, a power control loop or the like is enabled or energized so that a predetermined level of readout or reproduction current always can flow through the semiconductor laser and when the readout mode is switched to the write or recording mode, a current of a predetermined value is superposed on or added to the readout current and the current thus superposed flows to the semiconductor laser.

In addition, according to the present invention, the write or recording current; that is, the readout current plus a predetermined value of current as described above, can be precisely varied depending upon the relative speed between the position of a write-and-read head or the laser light spot and the surface of the disk so that the areas where data or information are to be recorded can be maintained under the same thermal conditions. That is, the recording areas of the recording medium on the disk can be maintained under the same or uniform thermal condition regardless of the variations in relative speed between the write-and-read head and the disk.

Of course, the data or information to be recorded modulates the laser light focused upon the record disk and the degree of modulation varies depending upon the contents of data or information. According to the present invention, when the laser light or beam is weakly modulated by, for instance, a binary digit "0" or "1", the power or intensity of laser light can be maintained at a lower level which is referred to as "the bias power or level" in this specification and which is lower than a threshold or critical level of the record disk, whereby the record disk can be "thermally biased" or preheated.

The above and other objects, effects and features of the present invention will become more apparent from the following description of a preferred embodiment thereof taken in conjunction with the accompanying drawings.

BRIEF DESCRIPTION OF THE DRAWINGS

Same reference numerals are used to designate similar parts throughout the figures.

DETAILED DESCRIPTION OF THE INVENTION

Figure 1:
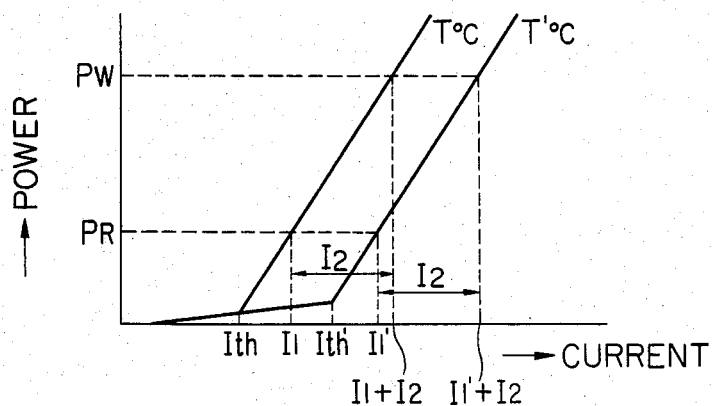
FIG. 1 shows a graph showing the relations of the semiconductor driving current versus the power or intensity of laser light or beam emitted from a semiconductor laser when the environmental temperatures are T°C. and T'°C., respectively and is used for explanation of the underlying principle of the present invention.

FIG. 1 shows the current-power characteristic curves of a semiconductor laser at environmental temperatures of T°C. and T'°C. (T°C.<T'°C.) and is used to explain the underlying principle of the present invention. Plotted along the abscissa is the current for driving the semiconductor laser and the power or intensity of the laser beam, along the ordinate. It is seen that when the temperature rises from T°C. to T'°C., the threshold current also increases from $I_{th}$ to $I_{th}'$. However, the slope of the current-power characteristic curves almost remains unchanged. To put into another way, the characteristic curve at T°C. is shifted to the right at T'°C. in such a way that they are almost in parallel with each other. Therefore, it follows that the same reproduction power of the laser beam can be maintained in the reproduction mode only by increasing or decreasing the current I depending upon the environmental temperature. More specifically, when the reproducing current is set $I_1$ at T°C. and $I_1'$ at T'°C., the same reproduction power $P_R$ can be maintained. By the same token, the recording power of the laser beam can be maintained at the same level even though the environmental temperature varies. More specifically, in the recording or writing mode, the reproducing current $I_1$ or $I_1'$ is increased by a predetermined current value of $I_2$ regardless of the environmental temperature T°C. or T'°C., whereby a predetermined recording power $P_W$ can be maintained. The increase of the reproducing current $I_1$ or $I_1'$ by $I_2$ or the superposition of the current $I_2$ upon the reproducing current $I_1$ or $I_1'$ has the advantage that the rise time; that is, the time interval from the reproducing power level to the recording power level $P_W$ becomes rapid.

Figure 2:
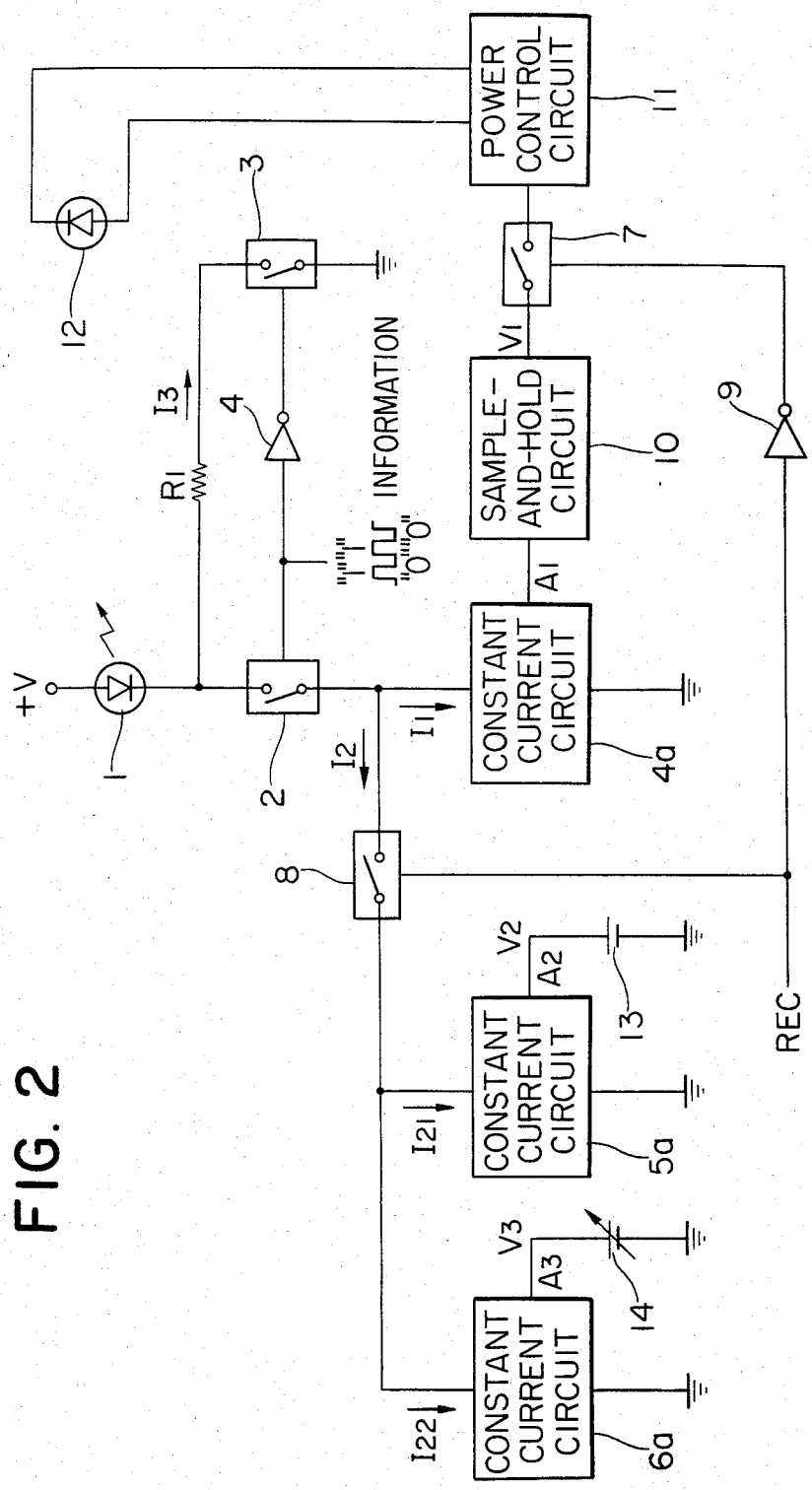
FIG. 2 shows a block diagram of a preferred embodiment of a system for driving a semiconductor laser in accordance with the present invention.

In FIG. 2 is shown in block diagram an embodiment of the present invention. A light source or write-and-read semiconductor laser 1 is connected to a gate 2 and to a gate 3 through a resistor $R_1$. Both the gates 2 and 3 can operate at an extremely high switching speed in response to the information to be recorded on a recording disk. More specifically, in response to the output from an inverter 4, the gate 2 is turned ON while the gate 3 is turned OFF and when the gate 2 is turned OFF, the gate 3 is turned ON. To put into another way, the gates 2 and 3 are alternately turned ON and OFF. The movable contact of the gate 2 is connected to a first constant current circuit 4a and further through a gate 8 to second and third constant current circuits 5a and 6a. The constant current circuits 4a, 5a and 6a control the currents flowing therethrough in response to the signals applied to their respective signal input terminals $A_1$, $A_2$ and $A_3$. The first constant current circuit 4a is connected through a sample-and-hold circuit 10 to a gate 7. The gate 7 is ON in the read or reproduction mode while the gate 8 is ON in the write or recording mode. A data input terminal REC is connected directly to the gate 8 and further the gate 7 through an inverter 9 which inverts a high level record command signal of REC into a low level as is well known in the art. The stationary contact of the gate 7 is connected to a power control circuit 11 which may be of the conventional type and controls the current fed back to the constant current circuit 4a in response to the output from a photosensor such as a pin photodiode 12 which, in turn, senses or monitors the intensity of the laser light emitted from the semiconductor laser 1. Power supplies 13 and 14 are connected to the constant current circuits 5a and 6a, respectively, whereby the second and third constant current circuits 5a and 6a determines the value of current flowing through the read-and-write semiconductor laser 1. It should be noted that the power supply 14 is so designed and constructed that its output $V_3$ varies depending upon areas where data are to be recorded move radially of the recording disk; that is, in the direction from the rim to the center of the recording disk.

Figure 3:
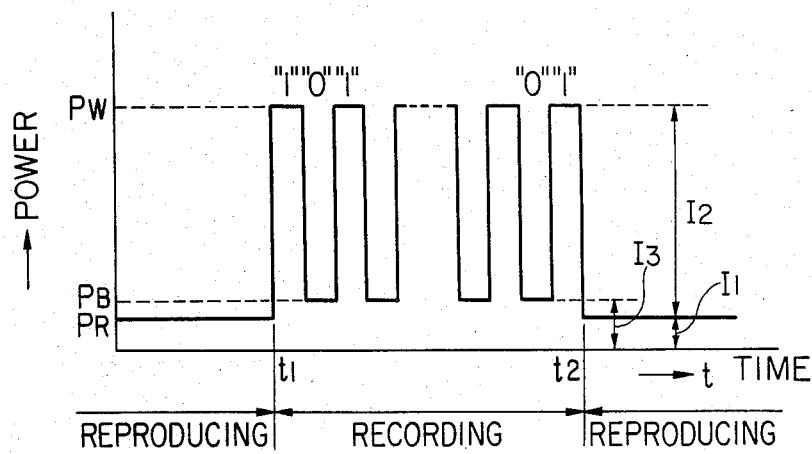
FIG. 3 shows the waveforms of the laser beam emitted from the semiconductor laser as shown in FIG. 2 and is used for explanation of the mode of operation of the embodiment.

Next, further referring to FIG. 3, the mode of operation of the driving system with the construction as shown in FIG. 2 will be described in detail below. In the read mode, the gates 2 and 7 are ON while the gates 3 and 8 are OFF. In response to the output from the photosensor 12 which is always sensing or monitoring the laser light emitted from the write-and-read semiconductor laser 1, the power control circuit 11 controls the semiconductor laser driving current $I_1$ in such a way that the power of the laser light can be substantially maintained at the predetermined level $P_R$ (See FIG. 1).

In the write or recording mode, the gate 8 is ON while gate 7 is OFF. The signal to be recorded consists of the digital signal consisting of "0s" and "1s". Alternatively, it is the signal derived through a suitable modulator such as a frequency modulator and an amplitude limiter. When a binary bit "1" lasts, the gate 2 is closed while the gate 3 is opened so that the current $(I_1+I_2)$ flows through the semiconductor laser 1. During the binary bit "0", the gate 3 is ON while the gate 2 is OFF so that the current $I_3$ flows through the read-and-write semiconductor laser 1. These currents flowing through the semiconductor laser 1 is assumed to have the following relations:

$$I_1+I_2>I_3 \text{ and}$$

$$I_1\simeq I_3$$

Then, only when the signal to be recorded is "1", the laser beam with the recording or writing power $P_W$ is focused on a predetermined area on the disk. Thus, the binary coded signals can be recorded on the disk.

When the signal to be recorded is "1", the gate 7 is OFF so that the power control circuit 11 does not operate or remains disabled, but the sample-and-hold circuit 10 holds the voltage $V_1$ which can cause the read current $I_1$ to flow. It follows, therefore, that the current $I_1$, which maintains the read power $P_R$, plus the current $I_2$ flows through the semiconductor laser 1.

As described hereinbefore, in the read mode, the reading or reproducing power $P_R$ can be maintained in a stable manner and in the write mode the write or recording current $I_2$ is superposed on the read current $I_1$ so that the power of laser light rises to the write or recording level $P_W$. Thus, regardless of the variations in the environmental temperature, the write or recording power $P_W$ can be maintained in a stable manner.

In general, in the case of a still picture or a sheet of paper to be filed, the recording time is considerably shorter than the reproduction time so that it may be considered that the sudden temperature variations are very rare during the recording time. Therefore, if the read current $I_1$ is maintained immediately before the recording or writing, the sufficiently stable recording or writing power $P_W$ can be attained even if the environmental temperature varies.

It should be noted here that the recording current $I_2$ or the current to be superposed on the writing current $I_1$ consists of $I_{21}$ and $I_{22}$ (See FIG. 2).

When signals are recorded on a disk which is rotating at a predetermined speed, the writing power $P_{WO}$ required for recording the signals in the areas adjacent or close to the rim of the disk is considerably different from the writing power $P_{WI}$ required for recording the signals in the areas close to the center hole of the disk. In general, $P_{WO} > P_{WI}$. Therefore, it is needed to vary the writing power $P_W$ depending upon the position of a head with respect to the disk; that is, a recording position. To this end, the output voltage $V_3$ of the power supply 14 is so controlled that as the write head proceeds radially inwardly from the rim to the center of the disk, the current $I_{22}$ is decreased accordingly. To put into another way, the current $I_{22}$ controls the writing power $P_W$ which in turns is dependent upon a recording area; that is, the position of the write head with respect to the recording disk.

The current $I_{21}$ is a current for compensating for the sensitivity or recording properties of a disk which is used. That is, the current $I_{21}$ is determined depending upon the physical and chemical properties of a disk used.

When the signal is "0", the gate 3 is closed while gate 2 is opened so that the current $I_3$, the value of which is dependent upon the value of the resistor $R_1$, flows through the semiconductor laser 1. The power of the laser beam emitted from the semiconductor laser 1 when the current $I_3$ flows therethrough is referred to as "the bias power $P_B$" in this specification. Then, the bias power $P_B$ is preferably selected a little lower than the threshold or critical power level which is the minimum power for permitting the recording of signal. To put into another way, when the signal is "0", the laser light with a low power level is focused on the recording disk so that an area where the signal "1" is to be recorded can be preheated. The preheating has the effect that the power for recording the signal "1" can be lowered. In practice, the bias power $P_B$ is close to the read power $P_R$.

In the embodiment, the rise time; that is, the time interval required for the read power $P_R$ to rise to the write power $P_W$ (See $t_1$ in FIG. 3) is dependent on the response time of the gate circuit 8 and is independent of the response characteristics of the power control circuit 10.

Figure 4:
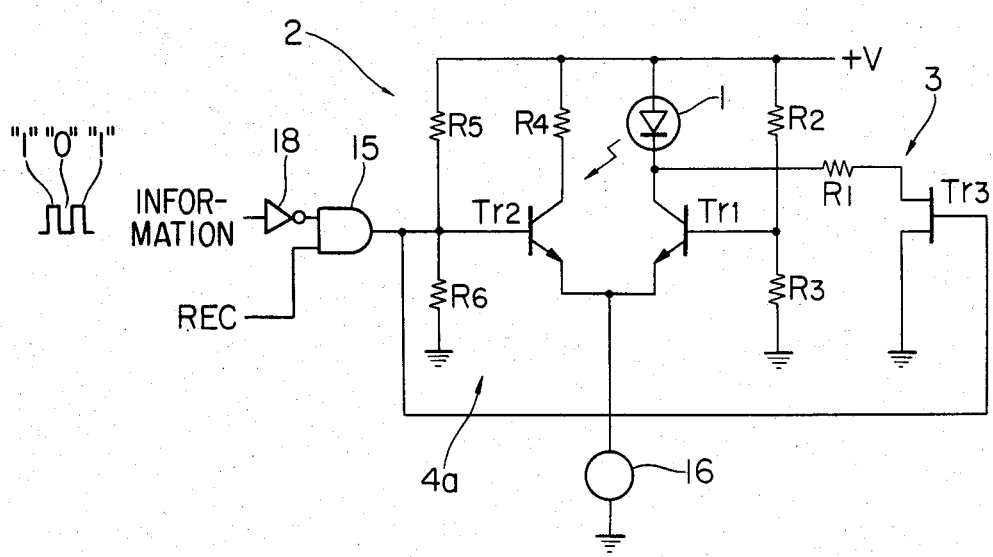
FIG. 4 shows an example of a detailed circuit diagram of gates 2 and 3 as shown in FIG. 2.
Figure 5:
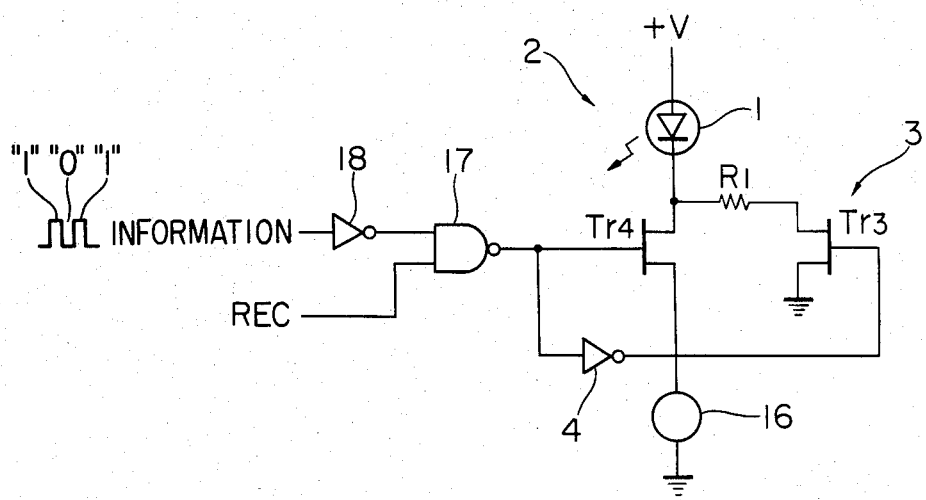
FIG. 5 shows another example of detailed circuit diagram of gates 2 and 3 as shown in FIG. 2.

In FIGS. 4 and 5 are shown, respectively, two examples of detailed circuit diagrams of the gates 2 and 3. The constant current circuits 4a, 5a and 6a as shown in FIG. 2 are represented by a single constant current circuit 16.

The circuit as shown in FIG. 4 includes a transistor pair $Tr_1$ and $Tr_2$ which alternately turns ON and OFF in response to the signal "1" and "0". Specifically, in response to the signal "1", the transistor 1 is turned ON, but the transistor 2 is turned OFF, and vice versa.

The circuit as shown in FIG. 4 is an example employing a field-effect transistor $Tr_4$ which also turns ON and OFF in response to the signals "1" and "0".

In both the circuits as shown in FIGS. 4 and 5, the bias power $P_B$ is supplied through a field-effect transistor $Tr_3$. More specifically, simultaneous with the ON-OFF action of the transistor $Tr_1$ or the field-effect transistor $Tr_4$, the field-effect transistor $Tr_3$ also turns ON and OFF so that in response to the input signal "0", the current flows through the resistor $R_1$ into the semiconductor laser 1. The circuit as shown in FIG. 4 further includes resistors $R_2$, $R_3$, $R_4$, $R_5$ and $R_6$ and an AND gate 15 while the circuit as shown in FIG. 5, a NAND gate 17 and an inverter 18.

Figure 6:
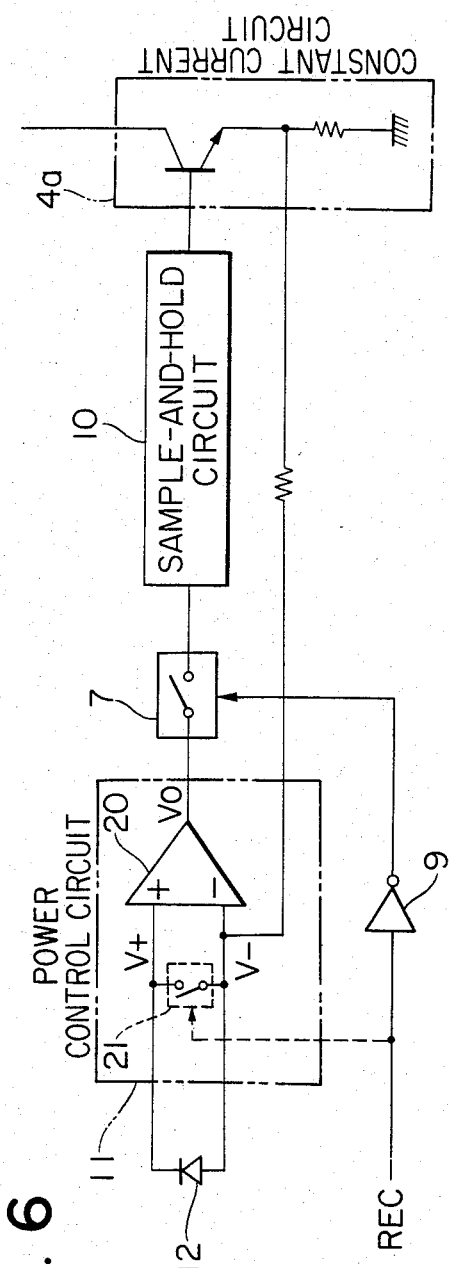
FIG. 6 shows a block diagram of a power control circuit and its associated component parts.
Figure 7:
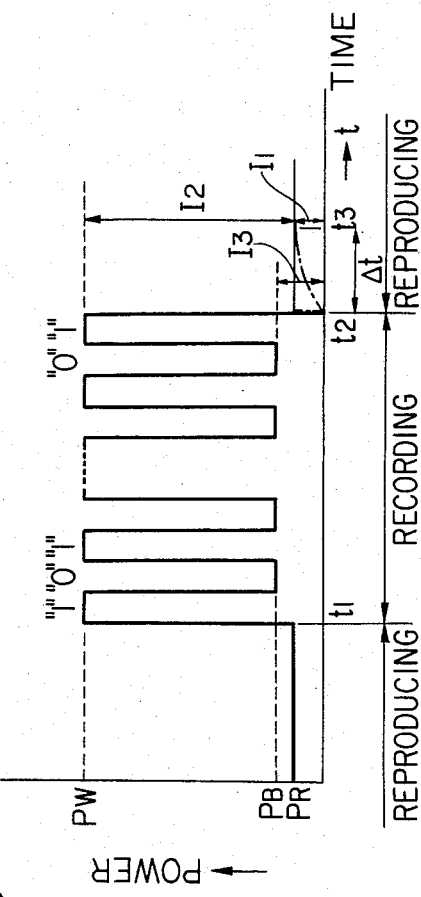
FIG. 7 shows a graph used to explain the mode of operation thereof.

Next, referring to FIGS. 6 and 7, the power control circuit 11 will be described in detail hereinafter. The photosensor 12 which senses or monitors the intensity of laser beam emitted from the semiconductor laser 1 has its cathode connected to the noninverting input (+) of an operational amplifier 20 and has its anode connected to the inverting input (−) thereof. Therefore, when the power of the laser beam is correctly controlled, the input voltages $V_+$ and $V_-$ to the operational amplifier 20 are equal to each other, so that the photosensor 12 is not biased. As compared with a photosensor which is always biased, this arrangement has the advantage that the variations in output current from the photosensor 12 due to the variations in environmental temperature can be reduced to a minimum.

When the optical writing and reading system is changed from the read mode to the write mode, the output voltage $V_O$ from the operational amplifier 20 is held in the sample-and-hold circuit 10 so that the read power $P_R$ can be very rapidly raised to the write power $P_W$.

In the write or recording mode, the gate 7 remains ON as described elsewhere and the photosensor 12 intercepts the write laser light of a relatively high intensity. As a result, the operational amplifier 20 delivers the output voltage $V_O$ which tends to decrease the power of laser light emitted from the semiconductor laser 1.

When, under these conditions, the write or recording mode is switched to the read or reproduction mode, the output voltage $V_O$ is delivered through the gate 7 to the constant current circuit 4a. As a consequence, the power of laser light emitted from the semiconductor laser 1 drops below the read or reproduction power $P_R$ as indicated by the broken or dot line in FIG. 7. Thereafter, the power control circuit 11 gradually raise the power of the laser light to the read power $P_R$.

Assume that the write mode is switched to the read mode at $t_2$ and that at $t_3$ the read power $P_R$ is completely stabilized. Then, the time difference $t_3 - t_2 = \Delta t$ is dependent upon the respond speed of the laser light power control loop and is, in general, from 400 microseconds to one millisecond. Such a relatively slow response speed gives rise to a problem in the case of a high-speed optical recording and reproducing device.

According to the present invention, this problem can be solved in the following manner. A gate 21 is interconnected between the two inputs (+) and (−) of the operational amplifier 20. In the write mode, this gate 21 is ON so that $V_+ = V_-$ which is approximately equal to $V_+ \approx V_-$ which relationship is maintained when the power control loop is operating and consequently the write or reproduction mode is substantially stabilized. Therefore, even when the power control loop is not operating in the write or recording mode, the operational amplifier 20 delivers the output voltage $V_O$ which is almost equal to the output voltage obtained in the read or reproduction mode. With this arrangement of the present invention, when the write mode is shifted to the write mode, the write power $P_W$ is rapidly lowered to the read power $P_R$. Thus, the high-speed reading can be ensured.

In summary, according to the present invention, in the read or reproduction mode, the laser light or beam power control loop can be stabilized; that is, operates in a stable manner, but in the case of the write or recording mode, the control loop is disabled or de-energized and an additional current or recording current is superposed to the read or reproducing current. As a result, the read or reproduction laser light power can be very rapidly raised to the write or recording laser light power independently of the response characteristics of the control loop as opposed to the prior art system. Furthermore, the read or reproduction laser beam power is always maintained at a predetermined level before the write or recording mode is initiated and a predetermined value of additional or recording current is superposed on the read or reproduction current so that the variations in the write or recording laser beam power can be reduced to a minimum regardless of variations in the environmental temperature. Consequently, the desired data or information can be immediately read or written from its beginning or leading end in a stable manner.

Moreover, if the bias power is additionally supplied or the write or recording laser beam power is controlled as a function of the distance in the radial direction of the recording disk from its rim in the write or recording mode, the write and read modes can be more positively stablized. Thus, highly reliable and dependable operation of the system for driving a semiconductor laser can be ensured.

What is claimed is:

1. An optical recording and reproducing device of the type in which the laser light emitted from a laser is used to write and read on and off a recording medium data represented in binary coded signals or binary digits "0s" and "1s", comprising, (a) a photosensor for sensing or monitoring the power of a laser beam emitted from said laser in the read or reproduction mode in which the binary coded data are recorded on said recording medium,
   (b) a laser light power control circuit which is responsive to the output from said photosensor for maintaining the read or reproduction current applied to said laser at a predetermined level,
   (c) a first gate means for disabling said laser light power control circuit in the write or recording mode in which binary coded data or information are recorded on said recording medium,
   (d) a sample-and-hold circuit for sampling and holding said read or reproduction current immediately before said write or recording mode is initiated,
   (e) a constant current circuit for providing a predetermined level of the write or recording current,
   (f) a second gate means for superposing the write or recording current on said read or reproduction current sampled and held in said sample-and-hold circuit immediately before the binary coded data are recorded on said recording medium, and for providing the current thus superposed to said laser, and
   (g) a third gate means for switching said superposed write or recording current on and off in response to the binary digits "0s" and "1s".

2. An optical recording and reproducing device as set forth in claim 1 wherein said recording medium is in the form of a disk, and a write or recording current control means is further provided which controls said superposed current for writing or recording in such a way that the same is gradually lowered in intensity in accordance with the distance from the rim of said disk in the radially inwards direction thereof.

3. An optical recording and reproducing device as set forth in claim 1 wherein a bias power supply means is provided which, in said write or recording mode, supplies a bias laser light power which is lower than a threshold or critical laser light power, which is a minimum power requirement for writing or recording the desired binary coded data, during a time interval during which a binary digit "0" or "1" lasts.

4. An optical recording and reproducing device as set forth in claim 1 wherein said laser light power control circuit comprises an operational amplifier which receives the output of said photosensor and flows the output voltage thereof through said first gate means and said sample-and-hold circuit to a laser driving current control means which, in response to a control voltage, varies the driving current which is applied to said semiconductor laser; and a fourth gate means interconnected between said first and second inputs of said comparator means in such a way that in the write or recording mode said first and second inputs of said comparator means can be short-circuited.

* * * * *